United States Patent
Templier et al.

(10) Patent No.: US 10,955,735 B2
(45) Date of Patent: Mar. 23, 2021

(54) COLOUR PROJECTOR WITH TWO EMISSIVE DISPLAYS

(71) Applicants: COMMISSARIAT A L'ENERGIE ATOMIQUE ET AUX ENERGIES ALTERNATIVES, Paris (FR); THALES, Courbevoie (FR)

(72) Inventors: Francois Templier, Grenoble (FR); Francois-Henri Luc, Paris la Defense (FR)

(73) Assignees: COMMISSARIAT A L'ENERGIE ATOMIQUE ET AUX ENERGIES ALTERNATIVES, Paris (FR); THALES, Courbevoie (FR)

( * ) Notice: Subject to any disclaimer, the term of this patent is extended or adjusted under 35 U.S.C. 154(b) by 0 days.

(21) Appl. No.: 16/627,232

(22) PCT Filed: Jun. 27, 2018

(86) PCT No.: PCT/FR2018/051565
§ 371 (c)(1),
(2) Date: Dec. 27, 2019

(87) PCT Pub. No.: WO2019/002757
PCT Pub. Date: Jan. 3, 2019

(65) Prior Publication Data
US 2020/0183264 A1      Jun. 11, 2020

(30) Foreign Application Priority Data
Jun. 29, 2017   (FR) ...................................... 1756049

(51) Int. Cl.
*G03B 21/14*          (2006.01)
*H04N 9/31*           (2006.01)
(Continued)

(52) U.S. Cl.
CPC ....... *G03B 21/2013* (2013.01); *G02B 27/102* (2013.01); *G02B 27/141* (2013.01);
(Continued)

(58) Field of Classification Search
CPC .... G03B 21/14; G03B 21/005; G03B 21/003; G03B 21/2013; G03B 21/2033;
(Continued)

(56) References Cited

U.S. PATENT DOCUMENTS 5,555,035 A * 9/1996 Mead ................... H04N 9/3105
                                              348/383
2004/0021831 A1    2/2004 Koide
(Continued)

FOREIGN PATENT DOCUMENTS

GB      2 414 127 A      11/2005
JP      2000-180823 A     6/2000
(Continued)

OTHER PUBLICATIONS

International Search Report dated Oct. 19, 2018 in PCT/FR2018/051565 filed on Jun. 27, 2018, 3 pages.
(Continued)

*Primary Examiner* — William C. Dowling
(74) *Attorney, Agent, or Firm* — Oblon, McClelland, Maier & Neustadt, L.L.P.

(57) ABSTRACT

The invention relates to an image projection system (200) configured to implement colour projection comprising: a first matrix device (210) with an emissive display for transmitting a first and a second colour component of a colour image, wherein each pixel is adapted to transmit at the wavelengths associated with the first colour component and the wavelengths associated with the second colour component; and a second matrix device (220) with an emissive display for transmitting a third colour component
(Continued)

(221) of the colour image. The colour image projector according to the invention offers both good energy efficiency and a small footprint.

11 Claims, 2 Drawing Sheets

(51) Int. Cl.

| | | |
|---|---|---|
| G03B 21/20 | (2006.01) | |
| G02B 27/10 | (2006.01) | |
| G02B 27/14 | (2006.01) | |
| G03B 21/28 | (2006.01) | |
| H01L 27/15 | (2006.01) | |
| H01L 33/06 | (2010.01) | |
| H01L 33/32 | (2010.01) | |

(52) U.S. Cl.
CPC ......... *G03B 21/2033* (2013.01); *G03B 21/28* (2013.01); *H01L 27/156* (2013.01); *H01L 33/06* (2013.01); *H01L 33/32* (2013.01); *H04N 9/3138* (2013.01); *H04N 9/3155* (2013.01); *H04N 9/3164* (2013.01)

(58) Field of Classification Search
CPC ...... G02B 27/102; H04N 9/31; H04N 9/3102; H04N 9/3111; H04N 9/3105; H04N 9/3123
See application file for complete search history.

(56) References Cited

U.S. PATENT DOCUMENTS

| | | |
|---|---|---|
| 2005/0099116 A1 | 5/2005 | Koide |
| 2005/0254127 A1 | 11/2005 | Evans et al. |
| 2007/0146655 A1* | 6/2007 | Li .............................. H04N 9/31 353/122 |
| 2016/0270176 A1 | 9/2016 | Robin et al. |
| 2019/0004413 A1* | 1/2019 | Templier .............. H04N 9/3138 |

FOREIGN PATENT DOCUMENTS

| | | |
|---|---|---|
| WO | WO 2007/053624 A2 | 5/2007 |
| WO | WO 2015/059296 A1 | 4/2015 |

OTHER PUBLICATIONS

Preliminary French Search Report dated Mar. 21, 2018 in FR1756049, 1 page

Z. Gong, et al., "Electrical, spectral and optical performance of yellow-green and amber micro-pixelated InGaN light-emitting diodes", Semiconductor Science and Technology, vol. 27, 2012, 015003 (7 pp).

* cited by examiner

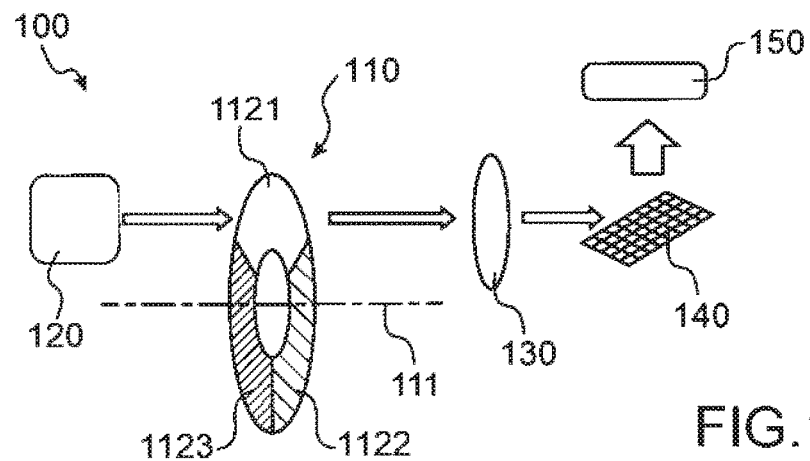
FIG.1 PRIOR ART
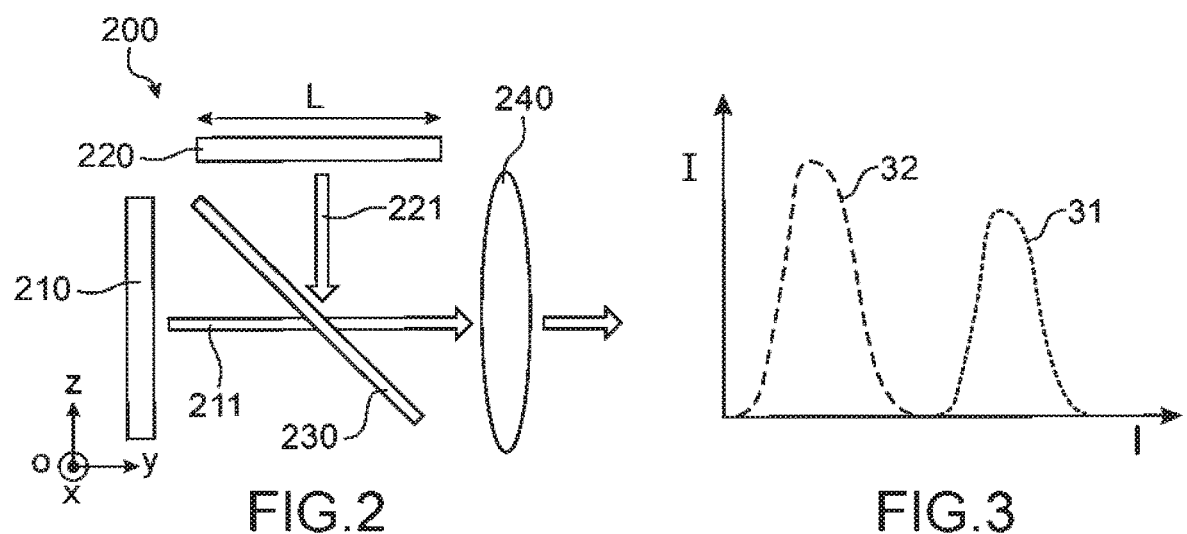
FIG.2
FIG.3
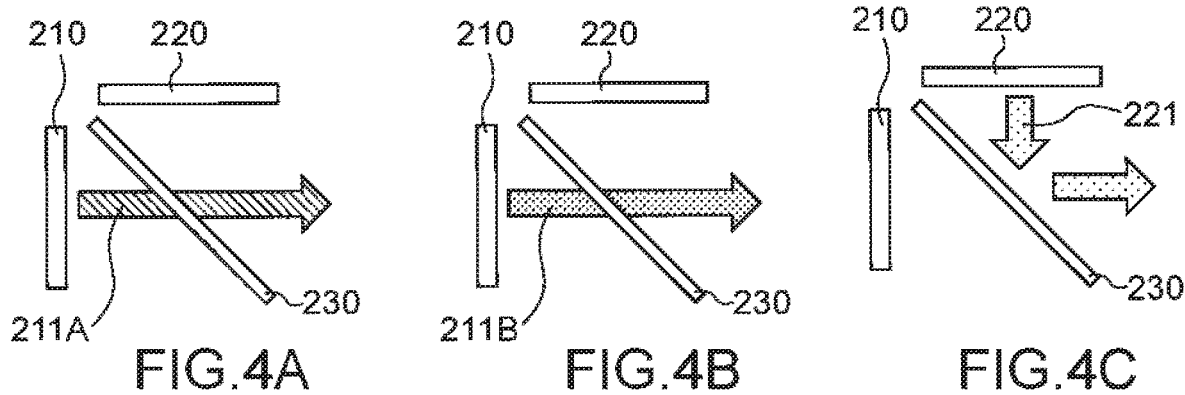
FIG.4A   FIG.4B   FIG.4C

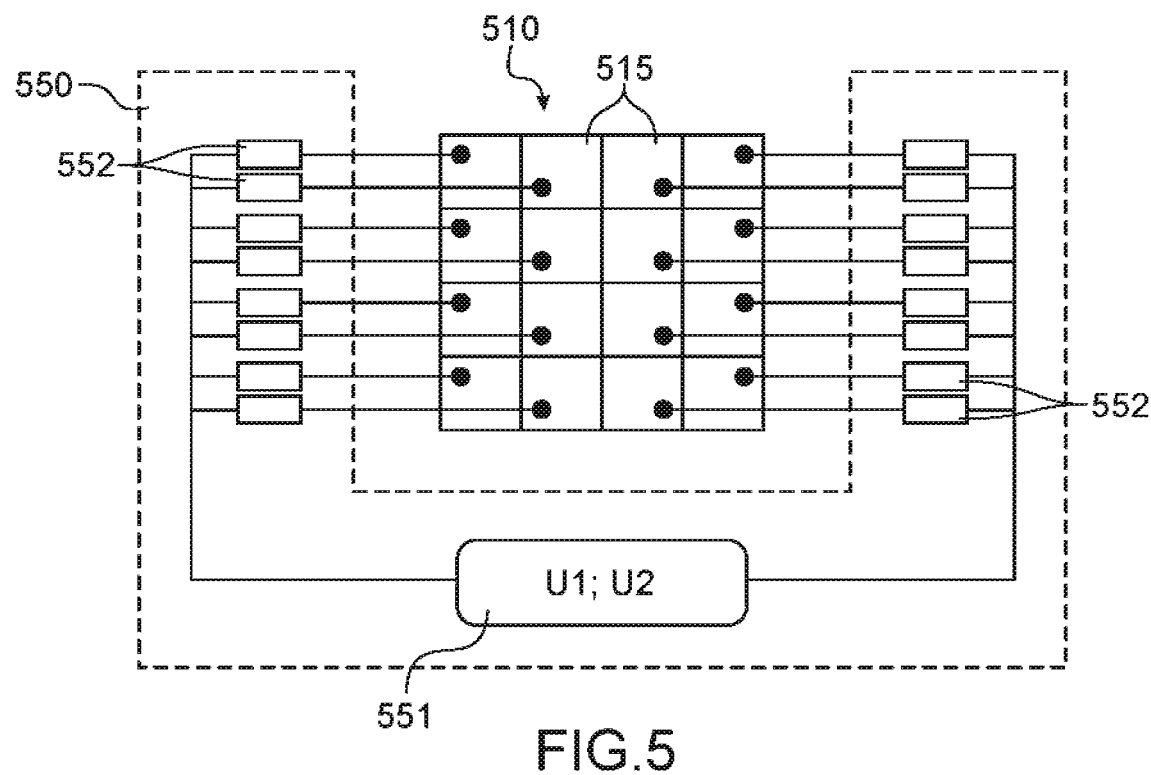
FIG.5
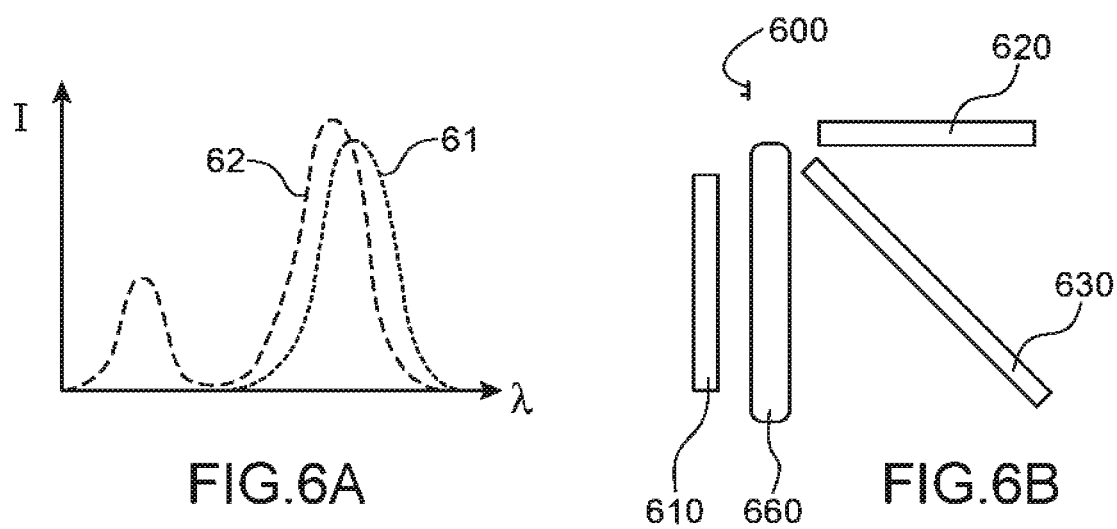
FIG.6A
FIG.6B

COLOUR PROJECTOR WITH TWO EMISSIVE DISPLAYS

TECHNICAL FIELD

A colour image can be broken down into several sub-images, each of a single colour, called chromatic components.

A colour image is preferably composed of three sub-images.

The invention relates to the field of colour image projection systems, and particularly colour video projection systems.

These projection systems project a colour image, by separate projection of each of the three chromatic components of this image. The projections are said to be separate, because they are separated in time or in space.

STATE OF PRIOR ART

Different types of projectors are known in prior art, and particularly projectors configured to make use of a sequential type of colour projection.

These are projectors configured to project the different chromatic (monochromatic) components of a colour image (polychromatic), one by one.

These different chromatic components preferably correspond to each of the three primary colours by additive synthesis: red, green and blue.

In the following, such a projector is simply called a "sequential type projector".

FIG. 1 diagrammatically illustrates a known embodiment of a sequential type of projector 100.

Operation of the projector 100 is based on the use of a colour filter wheel 110. It is a rotary disk, the surface of which is occupied by three spectral transmission filters 1121, 1122, 1123, transmitting blue, red and green respectively.

During operation, a white light source 120 emits a continuous signal with constant amplitude.

The colour wheel 110 is located on the optical path of the light beam emitted by the source 120, and rotates on itself to be in three positions successively.

In a first position, the light beam emitted by the source 120 passes through the colour wheel 110 at a first spectral filter 1121 transmitting blue only. In a second position, this beam passes through the colour wheel 110 at a second spectral filter 1122 transmitting red only. In a third position, this beam passes through the colour wheel 110 at a third spectral filter 1123 transmitting green only.

The light beam at the output from one of these spectral filters passes through a relay lens 130, and arrives on a reflective micro-screen 140 such as a Digital Micromirror Device.

The relay lens can be used to collimate the light beam emitted by the white light source 120, and therefore can also be located upstream from the colour wheel 110.

The reflective micro-screen 140 receives an approximately uniform signal in space. Each micro-mirror in the reflective micro-screen 140 receives a portion of this signal and can pivot between a position in which said signal portion is returned to an optical projection system 150, and a position in which said signal portion is returned in another direction. Different grey levels can be formed between these two positions by varying a proportion of the time during which the signal is sent to the optical projection system 150.

Thus, the reflective micro-screen 140 transforms a light beam representative of a uniform image, into a light beam representative of a pixelated image in grey levels.

The reflective micro-screen 140 successively forms different pixelated images, into grey levels.

The succession frequency of the positions of the colour wheel 110, and the succession frequency of images formed by the reflective micro-screen 140, are synchronized together.

Thus, the reflective micro-screen sends a blue image, then a green image and then a red image, and so on, in turn to the optical projection system 150.

In sending the blue, green and red components of a colour image in turn to the optical projection system 150, the projector 100 makes a sequential type colour image projection.

However, one disadvantage of this embodiment is its size.

Furthermore, each of the spectral filters making up the colour wheel 110 has a transmission coefficient of about 30%, which severely limits the energy efficiency of the projector 100.

One purpose of this invention is to disclose a colour image projector that is more compact.

Another purpose of this invention is to disclose a colour image projector that has high energy efficiency.

PRESENTATION OF THE INVENTION

This purpose is achieved with an image projection system configured to implement colour projection, comprising:
  a first emissive matrix display device, configured to emit first and second chromatic components of a colour image, and comprising a first pixel matrix in which each pixel is adapted to emit at wavelengths associated with said first chromatic component and at wavelengths associated with said second chromatic component; and
  a second emissive matrix display device, configured to emit a third chromatic component of the colour image.

Therefore the invention proposes to completely eliminate the concept of wavelength filters, and instead uses emissive matrix display devices outputting signals at the required wavelengths directly.

Therefore, this eliminates losses related to filters, which can give a colour image projector with good energy efficiency.

The invention also proposes to replace a light source and an image formation matrix element distinct from each other, by emissive matrix display devices performing both the light emission and image formation functions.

Thus, a compact colour image projector with a reduced size can be obtained.

This size is reduced especially in that a single emissive matrix display device according to the invention can be used to output two of the three chromatic components of a colour image.

The use of only two emissive matrix display devices to emit the three chromatic components of a colour image can also simplify beam deviation means implemented to assure that the three chromatic components of the image emerge from the image projection system along the same optical path.

The use of only two emissive matrix display devices for the emission of three chromatic components of a colour image can also reduce the manufacturing cost of the image projection system.

Finally, the solution disclosed herein is different from an obvious solution that would have consisted of using a three-colour emissive display device composed of a matrix of macro-pixels, each macro-pixel being composed of at least one blue pixel, one green pixel and one red pixel.

According to the invention, the projection can be fully sequential (the image projection system emits each of the three chromatic components of an image in turn), or partially sequential (the first emissive matrix display device emits the first and second chromatic components of an image, while the second emissive matrix display device emits the third chromatic component of the same image). The at least partially sequential projection makes higher display resolutions possible. Furthermore, all pixels of each of the two emissive matrix display devices can have the same emission spectrum, which simplifies their fabrication.

Nor is the first emissive display device composed of macro-pixels each comprising two types of pixels, a first type for emission of the first chromatic component, and a second type for emission of the second chromatic component. On the contrary, it comprises a pixel matrix in which each pixel participates in formation of the first and the second chromatic components of the colour image. Thus, all pixels of said matrix can have the same spectral characteristics in emission, which makes higher display resolutions possible and simplifies fabrication of the first emissive display device.

During operation, the first and second emissive matrix display devices project images corresponding to the different chromatic components of a colour image, each of these images being an image in "grey levels", each grey level corresponding to a predetermined luminance value (possibly averaged temporally by the eye).

The system according to the invention advantageously has the following characteristics:
said first pixel matrix is composed of a first matrix of light emitting diodes, wherein each light emitting diode has an emission spectrum that depends on the amplitude of its power supply voltage; and
the first emissive matrix display device is connected to first control means configured to supply said light emitting diodes with power supply voltages that alternately have a first amplitude associated with emission of the first chromatic component, and a second amplitude associated with emission of the second chromatic component.

The first control means may comprise pulse width modulation units, each light emitting diode in said first matrix being associated with a corresponding pulse width modulation unit.

Preferably, the light emitting diodes of said first matrix are multi-quantum well diodes, each comprising two types of quantum wells, which have different corresponding associated emission spectra.

As a variant, the light emitting diodes of said first matrix can be multi-quantum well diodes, each comprising a single type of quantum wells, all associated with the same emission spectrum.

Preferably, the light emitting diodes of said first matrix are diodes based on indium gallium nitride (InGaN).

Preferably, the second emissive matrix display device comprises a second matrix of light emitting diodes, based on indium gallium aluminium phosphide (InGaAlP).

Advantageously:
the first emissive matrix display device is configured to emit a green component and a blue component of a colour image; and
the second emissive matrix display device is configured to emit a red component of said colour image.

The image projection system according to the invention may also comprise beam deviation means arranged to superpose the optical paths followed by light signals emitted by the first and the second emissive matrix display devices respectively.

The beam deviation means may consist of a dichroic mirror.

Advantageously, the first emissive matrix display device comprises said first pixel matrix, the second emissive matrix display device comprises a second pixel matrix, and each of the first and second pixel matrices is a square or rectangular matrix with side dimensions equal to between 5 mm and 20 mm.

BRIEF DESCRIPTION OF THE DRAWINGS

This invention will be better understood after reading the description of example embodiments given purely for information and that are in no way limitative, with reference to the appended drawings on which:

FIG. 1 diagrammatically illustrates a sequential type of colour image projector according to prior art;

FIG. 2 diagrammatically illustrates a first embodiment of an image projection system according to the invention;

FIG. 3 illustrates emission spectra of the first emissive matrix display device of the system in FIG. 2;

FIGS. 4A to 4C diagrammatically illustrate operation of the system in FIG. 2;

FIG. 5 diagrammatically illustrates control of the first emissive matrix display device of the system in FIG. 2;

FIG. 6A illustrates the emission spectra of the first emissive matrix display device of a second embodiment of an image projection system according to the invention; and FIG. 6B illustrates said second embodiment of a system according to the invention.

DETAILED PRESENTATION OF PARTICULAR EMBODIMENTS

FIG. 2 diagrammatically illustrates a first embodiment of an image projection system 200 according to the invention.

The system 200 comprises in particular:
a first emissive matrix display device 210, comprising a first pixel matrix; and
a second emissive matrix display device 220, comprising a second pixel matrix.

The pixels of the first pixel matrix are distributed according to a square (or rectangular) matrix, with side dimensions L (L1, L2 respectively for a rectangular matrix) equal to between 5 mm and 20 mm in this case.

In this case, these pixels are distributed at a pitch P of less than 10 µm, for example equal to 5 µm.

Each of the first emissive matrix display devices 210 and the second first emissive matrix display device 210 forms a micro-screen.

The first and the second pixel matrices advantageously have the same dimensions, and the same pixel pitch.

Each of the first and second emissive matrix display devices is adapted to supply lighting with very high luminous density, for example equal to more than $10^3$ Cd/m$^2$, and even up to $10^7$ Cd/m$^2$.

Each pixel in the first and the second pixel matrix is composed of a light emitting diode (LED). Therefore each pixel matrix forms a LED matrix.

These light emitting diodes can be called micro-LEDs due to their dimensions of the order of a micrometer (distribution pitch in this case less than 10 µm).

The first LED matrix of the first emissive matrix display device 210 extends in the (xOz) plane of an orthonormal coordinate system (Oxyz).

It is configured to emit a light signal 211 that propagates along the (Oy) axis as far as a dichroic mirror 230.

The first LED matrix is composed of LEDs comprising indium and gallium, particularly LEDs based on indium gallium nitride (InGaN).

The different LEDs in the first LED matrix are identical to each other. In other words, they all have the same dimensions and the same composition.

According to the first embodiment of the invention, each of these LEDs comprises two types of structures, so that they can emit at one wavelength or another depending on a power supply voltage.

In particular, each of these LEDs is a multi-quantum well LED, comprising multi-quantum wells adapted to emit in the blue, in other words at a wavelength between 440 nm and 500 nm, and multi-quantum wells adapted to emit in the green, in other words at a wavelength between 510 nm and 570 nm.

In particular, each of these LEDs comprises two superposed structures with multi-quantum wells, that are different due to an associated corresponding spectrum.

More particularly, each of these LEDs comprises alternating stacks of GaN and InGaN, forming quantum wells for charge carriers. In a first part of the stack, the concentration of indium in the InGaN layers is equal to a first value adapted to emission in the blue. In a second part of the stack, the concentration of indium in the InGaN layers is equal to a second value adapted to emission in the green.

The structure of these LEDs will not be described in more detail herein, because the invention does not lie in such LEDs that do not pose any particular difficulty.

When the LED is powered by a first power supply voltage with a first amplitude value, not equal to zero, the quantum walls of a first type will be excited and the LED emits in the green.

When the LED is powered by a second power supply voltage with a second amplitude value, not equal to zero, the quantum walls of a second type will be excited and the LED emits in the blue.

FIG. 3 illustrates this phenomenon. FIG. 3 illustrates the emission spectra (light intensity I as a function of the wavelength $\lambda$) of such a LED, for said first power supply voltage (spectrum 31) and for said second power supply voltage (spectrum 32).

When the LED is powered by the first power supply voltage, its spectrum 31 contains an emission peak in the green.

This spectrum 31 may include additional peaks, not used by the image projection system 200, located outside the visible spectrum (between 400 nm and 800 nm) and the near ultra-violet (about 300 nm to 400 nm).

In any case, in the following it is considered that the spectrum 31 is monochromatic, and corresponds to a monochromatic emission in the green.

When the LED is powered by the second power supply voltage, its spectrum 32 contains an emission peak in the blue.

This spectrum 32 may have additional peaks, not used by the image projection system 200, located outside the visible spectrum and the near ultra-violet.

In any case, in the following it is considered that the spectrum 32 is monochromatic, and corresponds to a monochromatic emission in the blue.

The first power supply voltage is less than the second power supply voltage.

The difference between these two voltages may for example be between 0.5 and 1.5 V.

In this case the first power supply voltage is equal to 4 V, and the second power supply voltage is equal to 5 V.

It will be noted that the power supply current and the power supply voltage can be considered indifferently, these two parameters being related, the values of each increasing or decreasing together.

During operation, all LEDs in the first LED matrix are powered at each instant by corresponding power supplies all having the same amplitude. This amplitude corresponds alternately to the first and then to the second power supply voltage as described above.

Thus, depending on the power supply voltage of the LEDs, the first LED matrix is adapted to emit:
  a light signal 211A having the emission spectrum 31 (see FIG. 4A); or
  a light signal 211B having the emission spectrum 32 (see FIG. 4B).

Light signals 211A and 211B are not emitted simultaneously, they are emitted one after the other.

Each of the light signals 211A and 211B is formed from the illumination produced by the first LED matrix of the first emissive matrix display device 210.

Therefore each of them corresponds to an image pixelated "in grey levels" formed on said LED matrix, in which each pixel in the image corresponds to a LED in the LED matrix and in which the grey level of this pixel corresponds to the luminance of the associated LED.

In the following, it is considered that this grey level also corresponds to the light intensity of the beam emitted by the associated LED.

The spectrum of the light signal 211A has a wavelength with an emission peak in the green.

This light signal 211A corresponds to the green component of a colour image.

The spectrum of the light signal 211B has a wavelength with an emission peak in the blue.

This light signal 211B corresponds to the blue component of a colour image.

The second LED matrix of the second emissive matrix display device 220 extends in the (xOy) plane of the same orthonormal coordinate system (Oxyz).

Therefore it extends orthogonal to the first LED matrix.

It is configured to emit a light signal 221 that propagates along the (Oz) axis as far as the dichroic mirror 230.

The second LED matrix is composed of LEDs comprising indium and gallium, particularly LEDs based on indium gallium aluminium nitride (InGaAlP).

The different LEDs in the second LED matrix are identical to each other. In other words, they all have the same dimensions and the same composition.

The emission spectrum of the second LED matrix has an emission peak in the red, in other words centred on a wavelength between 600 nm and 750 nm.

This emission spectrum may have additional peaks, not used by the image projection system, located outside the visible spectrum and the near ultra-violet, for example in the infrared.

In any case, in the following it is considered that the second emissive matrix display device 220 outputs a monochromatic emission in the red.

Once again, the light signal 221 emitted by the second emissive matrix display device 220 corresponds to an image pixelated "in grey levels" formed on the second LED matrix, in which each pixel of the image corresponds to a LED in the second LED matrix, and in which the grey level of this pixel corresponds to the luminance of the associated LED and to the light intensity of the beam emitted by said associated LED.

This light signal 211 corresponds to the red component of a colour image.

In this case, the dichroic mirror 230 is inclined at 45° relative to the (Oy) and (Oz) axes, parallel to the (Ox) axis.

In this case it is adapted to transmit wavelengths shorter than 580 nm, and to reflect wavelengths longer than 580 nm.

Thus, the light signal 211 emitted by the emissive matrix display device passes through the dichroic mirror 230, while the light signal 221 emitted by the second emissive matrix display device is reflected on the dichroic mirror 230.

At the output from the dichroic mirror 230, the optical paths of the light signal 211 and the light signal 221 are coincident.

The dichroic mirror 230 forms beam deviation means arranged to superpose the optical paths followed by the light signals 211 and 221.

In this case, this superposition is obtained using a dichroic mirror alone, due to the layout of the two LED matrices orthogonal to each other.

However, the invention is not limited to this example, other layouts of LED matrices can be used, and the beam deviation means can then comprise additional optical elements.

In this case, the system 200 according to the invention also comprises an optical projection system 240, comprising at least one refractive optic, and configured to form an enlarged image on a determined focussing plane, of alternately the first and the second LED matrix (depending on whether the first or the second emissive matrix display device is emitting a light signal).

During operation, the system 200 according to the invention emits the following for each among a plurality of colour images:
  a light signal 211A corresponding to the green component of the colour image (see FIG. 4A);
  a light signal 211B corresponding to the blue component of the colour image (see FIG. 4B);
  a light signal 211C corresponding to the red component of the colour image (see FIG. 4C);

The different chromatic components of the same colour image can be emitted one after the other, corresponding to a purely sequential type projection. These different components can then follow each other in one order or another.

As a variant, the green and blue components of the same colour image are emitted in turn (in one order or another), while the red component is emitted at the same time as the blue and/or green component is emitted. The term partially sequential projection can be used. Emission of the red component can take place throughout the entire emission or during part of the emission of the blue and/or green component.

The succession of said chromatic components can be controlled by control means, not shown, configured to control the successive display of the chromatic components of a plurality of colour images.

The different chromatic components succeed each other particularly at a frequency f of N components per second, corresponding to scrolling of colour images at a frequency of 3*N images per second in the purely sequential case, or 2*N images per second in the partially sequential case.

The value of N is generally equal to 50. It can be advantageous for the image quality (particularly to reduce flicker) to increase this value of N to 100 or 200. The invention makes such values of N possible, due to the use of LED matrices with a very fast response time. Such values cannot be achieved with systems according to prior art based on the use of micro-screens such as LCD microscreens.

The control means mentioned above will not be described herein in more detail. Details of their use do not present any difficulty for an expert in the subject, specialist in sequential type colour display.

In the second LED matrix, the light intensity emitted by each LED depends on the amplitude of its power supply voltage.

Therefore the control means are configured to convert grey levels on the red component of a colour image, into corresponding amplitude values of power supply voltages, at the input to each LED of said second matrix.

It is equivalent to consider that said control means are configured to convert grey levels into values of the LED power supply current, the voltage and the current being related.

In the first LED matrix, the amplitude of the power supply voltage of a LED is used to select emission in the blue or in the green.

The different values of the light intensity necessary to obtain grey level images are then obtained by modulating the pulse width, the eye only being sensitive to an average value of the light intensity of the modulated light signal emitted by each LED.

Therefore the light intensity emitted by a LED depends on the ratio between a voltage pulse width and the pulse repetition period, the pulse amplitude being fixed. In the following, this ratio is simply called the "cyclic ratio".

Throughout the text, the term "amplitude" designates a maximum value of the signal, and not an average value or an rms value of the amplitude. Therefore the value of the amplitude as defined herein is not a function of the ratio between the pulse width and the pulse repetition period.

Therefore the control means are configured to convert grey levels on the green component and on the blue component, into values of the cycle ratios of the corresponding power supply voltages, at the input to each LED of said first matrix.

Once again, it is equivalent to consider that the amplitude of the power supply current of a LED is used to select emission in the blue or in the green, and that said control means are configured to convert grey levels into values of the cyclic ratio of the power supply current of the LED, since the voltage and the current are related.

FIG. 5 diagrammatically represents the first matrix display device 510, and means 550 of controlling it, called first control means.

These first control means 550 form part of the control means mentioned above.

They comprise:
  means 551 of selecting an amplitude of power supply voltages, among a first value U1 associated with display of the green component of a colour image, and a second value U2 associated with display of the blue component of the same image, and
  pulse width modulation units 552, each associated with one of the LEDs 515 of the LED matrix in the first matrix display device 510, and each configured to make a pulse width modulation at a predetermined cyclic ratio.

Therefore the number of units 552 is the same as the number of LEDs in the first LED matrix.

Preferably, each unit 552 converts a dc signal equal to the value U1 (or U2) into an alternating signal, preferably rectangular, alternating between the value U1 and a value less than U1, preferably the value zero (or between the value U2 and a value less than U2, preferably equal to the value zero).

All that are mentioned herein are LED control elements relevant to the invention, while an active LED matrix comprises many other connections for addressing LEDs, in a known manner.

FIGS. 6A and 6B illustrate a second embodiment of an image projection system 600 according to the invention.

Only the differences between the system 600 and the first embodiment of the invention will be described.

The system 600 is illustrated on FIG. 6B. In order to avoid overloading the figure, no projection lens is shown at the output from the dichroic mirror 630 because such a lens is not essential for the definition of the invention.

In this description, the LEDs of the first LED matrix only comprise one sort of quantum well, adapted to emission in the green. All the quantum wells are associated with the same emission spectrum (for equal power supply voltages, see below).

More particularly, each of these LEDs comprises alternating stacks of GaN and InGaN, forming quantum wells for charge carriers. The concentration of Indium in the InGaN layers is equal to a value adapted to emission in the green.

As before, each of these LEDs is adapted to emit the blue component and the green component of a colour image, in turn.

An effect known as the blueshift is ingeniously used for this purpose, when the amplitude of the power supply voltage increases strongly.

This blueshift was identified particularly in the paper entitled "*Electrical, spectral and optical performance of yellow-green and amber micro-pixelated InGaN light-emitting diodes*", Z. Gong & al., Semiconductor Science and Technology, 27 (2012) 015003 (7 pp).

However, this paper only relates to elimination of this spectral shift, while on the contrary the invention discloses that it can be used to obtain emission in the green or emission in the blue, as required.

FIG. 6A illustrates emission spectra of a LED of the first matrix display device 610, for a first power supply voltage (spectrum 61) and for a second power supply voltage with a much higher amplitude (spectrum 62).

When the LED is powered by the first power supply voltage, its spectrum 61 contains an emission peak in the green.

This spectrum may include additional peaks, not used by the image projection system, located outside the visible spectrum and the near ultra-violet.

In any case, in the following it is considered that the spectrum 61 is monochromatic, and corresponds to a monochromatic emission in the green.

When the LED is powered by the second power supply voltage, its spectrum 62 contains an emission peak in the blue.

It will be observed that in this case, the spectrum 62 also has an emission peak in the green.

This marginal emission peak can be eliminated by simple optimization of the LEDs of the first matrix display device 610.

In this case, a spectral filter described below will be used to obtain the emission of a monochromatic signal in the blue.

As before, the first power supply voltage (associated with emission in the green) is less than the second power supply voltage (associated with emission in the blue).

In order to obtain this spectral shift effect, the difference between these two voltages must be high, for example more than 2 V.

In this case the first power supply voltage is equal to 4 V, and the second power supply voltage is equal to 6.5 V.

All details relative to control of LEDs are also applicable in this second embodiment of the invention.

In this case, the system 600 according to the invention comprises a spectral filter 660, configured to:
  allow wavelengths between 440 nm and 500 nm (blue) to pass, and block wavelengths between 510 nm and 570 nm (green), when the first matrix display device 610 emits in the blue and the green (high value of the power supply voltage); and
  allow wavelengths between 510 nm and 570 nm (green) to pass when the first matrix display device 610 emits in the green and does not emit in the blue (low value of the power supply voltage).

Therefore the filter 660 is advantageously a filter with an adjustable wavelength, the filter characteristics of which depend on an electric control signal. A filter with an adjustable wavelength makes it possible to achieve very high switching speeds, compatible with a succession frequency of chromatic components, for a colour video projection.

The filter 660 is placed on the optical path of the light signal emitted by the first matrix display device 610, preferably between this device 610 and the dichroic mirror 630.

Control of the wavelength tunable filter 660 and control of the LEDs are synchronized with each other by synchronization means, not shown.

Thus, by using a filter 660, the first matrix display device 610 can be used to obtain, in turn, a monochromatic signal in the blue corresponding to the blue chromatic component of a colour image, and a monochromatic signal in the green corresponding to the green chromatic component of a colour image.

However, the invention is not limited to this solution for making the filter. As a variant, the spectral filter 660 comprises a wheel filter with two regions. A first region comprises a spectral filter that allows blue to pass and blocks green. A second region is transparent, with no spectral filter. Once again, rotation of the filter wheel is synchronized with control of LEDs in the first matrix display device 610

The second embodiment of the invention is easier to fabricate than the first embodiment (only one type of quantum well in the first pixel matrix), but its opto-electrical efficiency is lower (a higher power supply voltage is necessary to obtain emission in the blue).

The invention is not limited to the examples described above, and many variants can be used without going outside the framework of the invention.

For example, each of the emissive matrix display devices can be composed of light emitting diodes other than the examples mentioned above.

A filter like that described above can possibly be combined with the first embodiment of the invention, when excitation of one type of quantum well causes excitation of the other type of quantum well, in the first LED matrix.

Similarly, a variant without a filter can be used in the second embodiment of the invention, when the frequency blueshift is accompanied by a significant reduction in the amplitude of the emission peak in the green.

The invention can also use a spectral decomposition other than the decomposition into the red, blue and green primary colours.

The invention is used in advantageous applications in the field of compact projectors, and Head up displays (HUD).

The invention claimed is:

1. An image projection system, configured to implement a colour projection, comprising:
    a first emissive matrix display device, configured to emit first and second chromatic components of a colour image, and comprising a first pixel matrix in which each pixel is composed of a light emitting diode adapted to emit at wavelengths associated with said first chromatic component and at wavelengths associated with said second chromatic component; and
    a second emissive matrix display device, configured to emit a third chromatic component of the colour image.

2. The image projection system according to claim 1, wherein:
    said first pixel matrix is composed of a first matrix of light emitting diodes, wherein each light emitting diode has an emission spectrum that depends on the amplitude of its power supply voltage; and
    the first emissive matrix display device is connected to first control means configured to supply said light emitting diodes with power supply voltages that alternately have a first amplitude associated with emission of the first chromatic component, and a second amplitude associated with emission of the second chromatic component.

3. The image projection system according to claim 2, wherein the first control means comprise pulse width modulation units each light emitting diode in said first matrix being associated with a corresponding pulse width modulation unit.

4. The image projection system according to claim 1, wherein the light emitting diodes of said first matrix are multi-quantum well diodes, each comprising two types of quantum wells, which have different corresponding associated emission spectra.

5. The image projection system according to claim 1, wherein the light emitting diodes of said first matrix are multi-quantum well diodes, each comprising a single type of quantum wells, all of which are associated with the same emission spectrum.

6. The image projection system according to claim 1, wherein the light emitting diodes of said first matrix are diodes based on indium gallium nitride.

7. The image projection system according to claim 1, wherein the second emissive matrix display device comprises a second matrix of light emitting diodes, based on indium gallium aluminium phosphide.

8. The image projection system according to claim 1, wherein:
    the first emissive matrix display device is configured to emit a green component and a blue component of a colour image: and
    the second emissive matrix display device is configured to emit a red component of said colour image.

9. The image projection system according to claim 1, wherein it also comprises beam deviation means arranged to superpose the optical paths followed by light signals emitted by the first and the second emissive matrix display devices respectively.

10. The image projection system according to claim 9, wherein the beam deviation means consist of a dichroic mirror.

11. The image projection system according to claim 1, wherein the first emissive matrix display device comprises said first pixel matrix, the second emissive matrix display device comprises a second pixel matrix, and each of the first and second pixel matrices is a square or rectangular matrix with side dimensions equal to between 5 mm and 20 mm.

* * * * *